United States Patent
Minamio et al.

(10) Patent No.: US 8,704,362 B2
(45) Date of Patent: Apr. 22, 2014

(54) RESIN-DIAMAGNETIC MATERIAL COMPOSITE STRUCTURE

(75) Inventors: Masanori Minamio, Osaka (JP); Daisuke Ujihara, Osaka (JP); Hiroshi Wada, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/591,294

(22) Filed: Aug. 22, 2012

(65) Prior Publication Data

US 2013/0049187 A1 Feb. 28, 2013

(30) Foreign Application Priority Data

Aug. 24, 2011 (JP) ............................... P 2011-182452
Jul. 20, 2012 (JP) ............................... P 2012-161701

(51) Int. Cl.
- *B32B 9/04* (2006.01)
- *H01L 23/34* (2006.01)
- *B32B 15/08* (2006.01)
- *B32B 5/16* (2006.01)
- *B32B 7/02* (2006.01)
- *B32B 5/02* (2006.01)
- *H01L 21/56* (2006.01)
- *B29C 67/24* (2006.01)

(52) U.S. Cl.
USPC .............. 257/712; 257/E23.08; 257/E21.499; 257/713; 257/717; 257/675; 438/3; 264/437; 428/457; 428/408; 428/213; 428/336; 428/323

(58) Field of Classification Search
USPC ............ 257/712, 713, 717, E21.499, E23.08, 257/675; 438/3; 264/437; 428/457, 408, 428/213, 336, 323
See application file for complete search history.

(56) References Cited

U.S. PATENT DOCUMENTS

| | | | | |
|---|---|---|---|---|
| 5,136,095 | A * | 8/1992 | Tarnowski et al. | 564/286 |
| 6,649,012 | B2 * | 11/2003 | Masayuki et al. | 156/272.4 |
| 6,660,566 | B2 * | 12/2003 | Masayuki | 438/124 |
| 7,201,972 | B2 * | 4/2007 | Shiozaki et al. | 428/614 |
| 7,292,441 | B2 | 11/2007 | Smalc et al. | |
| 7,326,497 | B2 * | 2/2008 | Matsubara et al. | 429/231.8 |
| 7,834,727 | B2 * | 11/2010 | Delamare et al. | 335/279 |
| 2005/0064230 | A1 | 3/2005 | Sayir et al. | |
| 2005/0237140 | A1 * | 10/2005 | Rostaing et al. | 335/229 |
| 2006/0126304 | A1 | 6/2006 | Smalc et al. | |
| 2006/0145796 | A1 * | 7/2006 | Delamare et al. | 335/220 |
| 2006/0182945 | A1 * | 8/2006 | Yoneyama et al. | 428/304.4 |
| 2007/0053168 | A1 | 3/2007 | Sayir et al. | |
| 2008/0151515 | A1 * | 6/2008 | Das et al. | 361/761 |
| 2010/0326645 | A1 | 12/2010 | Fan et al. | |
| 2013/0171559 | A1 * | 7/2013 | Nakamura et al. | 430/111.32 |
| 2013/0192793 | A1 * | 8/2013 | Guckert et al. | 165/49 |

* cited by examiner

FOREIGN PATENT DOCUMENTS

| | | |
|---|---|---|
| JP | 2006-165153 | 6/2006 |
| JP | 2007-273943 | 10/2007 |
| JP | 3147891 | 1/2009 |
| JP | 2013-62486 | * 4/2013 |

*Primary Examiner* — Alexander Oscar Williams

(74) *Attorney, Agent, or Firm* — Wenderoth, Lind & Ponack, L.L.P.

(57) ABSTRACT

A composite structure 10 of a resin-diamagnetic material, including a diamagnetic material layer 12 and a resin layer 14 is obtained by a method including disposing particles of a diamagnetic material 22 and a resin 24 in a mold 30, applying a magnetic field to the diamagnetic material 22 disposed in the mold 30, and moving the diamagnetic material 22 in a direction away from at least a part of an inner surface of the mold 30, and then curing the resin 24 in the mold 30 thereby to produce a resin-diamagnetic material composite structure.

14 Claims, 6 Drawing Sheets

(a)

(b)

(a)

(b)

(a)

(b)

(c)

(d)

Prior Art

RESIN-DIAMAGNETIC MATERIAL COMPOSITE STRUCTURE

BACKGROUND OF THE INVENTION

1. Field of the Invention

The present invention relates to a resin-diamagnetic material composite structure, and particularly to a resin-diamagnetic material composite structure that is useful as a heat dissipating member of a semiconductor device.

2. Description of the Related Art

As components that assume the effective utilization of energy, for example, there are a power element having a function of controlling electric power of a power supply, and a power module including the power element incorporated therein. Examples of important elements in the development of the power element include a semiconductor material that constitutes the power element. In the power element, it is proposed that materials such as GaN capable of coping with higher frequency and SIC having higher voltage resistance are used in place of conventional Si-based materials, and these materials are put into practical use.

When these materials are used, it is required to efficiently disperse heat generated from a power element to the surrounding environment. Thus, a substrate on which a power element is mounted is formed of a material having high heat dissipation, or a radiating plate or a radiating fin (collectively referred to as a "radiating member") is provided adjacent to a substrate or a power element.

When a substrate is formed of a material (for example, metal) having high heat dissipation (thermal conductivity), the substrate often has electrical conductivity together with thermal conductivity. Therefore, in order to ensure insulation properties on a surface of a substrate, an insulating resin layer (layer of an insulating material) is disposed on a surface of a substrate, or a substrate is formed using a material prepared by kneading a resin having insulation properties with a material having high thermal conductivity.

As a heat dissipating plate, for example, a plate made of a metallic material such as copper (Cu) (metal plate) is used. The metallic material commonly has conductivity. For this reason, when a metal plate (radiating plate) is made adjacent directly to a substrate or a power element, electric continuity is generated, exerting an adverse influence on an operation of the power element or the power module. Therefore, the metal plate (radiating plate) is used in a state of being adjacent to a substrate or a power element via a layer made of an insulating material.

In other words, it is necessary for either a heat dissipating substrate or a radiating plate of a power module to use an insulating material (specifically, a resin). Regarding the heat dissipating substrate or radiating plate including a layer made of an insulating material, heat dissipation may be inhibited by the layer made of an insulating material, resulting in deterioration of heat dissipation characteristics. In a substrate in which a resin is mixed with a material having high thermal conductivity, the material having high thermal conductivity may be sometimes bonded in the resin to form conduction paths, and thus failing to ensure desired insulation properties.

These inconveniences may be avoided by an improvement in heat dissipation characteristics by using a material having higher thermal conductivity thereby to compensate deterioration of heat dissipation characteristics by use of an insulating resin. An attention is paid on graphite as the material having higher thermal conductivity than that of copper (Cu), and it is proposed to use the graphite for heat dissipation (see, for example, JP-A-2006-165153).

FIG. 6 is a partial cross-sectional view of a thermal conductive sheet disclosed in JP-A-2006-165153. As shown in FIG. 6, JP-A-2006-165153 discloses that a thermal conductive sheet 1 is configured that a plurality of small pieces 6 of a graphite sheet are mixed in an insulating sheet 5 made of a resin. JP-A-2006-165153 discloses that, with such a configuration, individual small pieces of a graphite sheet are independently disposed in an insulating sheet, ensuring electrical insulation properties while making use of high thermal conductivity possessed by the graphite sheet.

SUMMARY OF THE INVENTION

In the configuration of a conventional radiating member, members having thermal conductivity (for example, small pieces of a graphite sheet in a thermal conductive sheet disclosed in JP-A-2006-165153) may be sometimes exposed from a layer made of an insulating material, resulting in deterioration of electrical insulation properties. In order to avoid such a problem, a composite structure may be produced by covering a member having thermal conductivity with a resin sheet.

However, the present inventors have studied and found that a composite structure covered with such a resin sheet may sometimes exhibit unsatisfactory adhesion of a member having thermal conductivity to a resin sheet. Therefore, it has found it necessary to appropriately select a material of an adhesive used to bond a resin sheet to a thermally conductive member, in order to improve integrity between them. Selection of the material of the adhesive may sometimes restrict applications of a radiating member.

An object of the present invention is to provide a composite structure composed of a material having excellent thermal conductivity and/or electrical conductivity, and a resin, both of which are satisfactorily fixed to each other.

In order to achieve the above object, a resin-diamagnetic material composite structure of the present invention is characterized by including diamagnetic material layer, and a resin layer that covers at least a part of a surface of the diamagnetic material layer, wherein the diamagnetic material layer is a layer formed by aggregation of particles of a diamagnetic material.

In order to achieve the above object, a method for producing a resin-diamagnetic material composite structure of the present invention is characterized in that it includes disposing particles of a diamagnetic material and a resin in a mold, applying a magnetic field to the diamagnetic material disposed in the mold, and moving the diamagnetic material in a direction away from at least a part of an inner surface of the mold, and then curing the resin in the mold thereby to produce a composite structure.

According to the present invention, it is possible to provide a composite structure composed of a material having excellent thermal conductivity and/or electrical conductivity, and a resin, both of which are satisfactorily fixed to each other.

DESCRIPTION OF THE EMBODIMENTS

Figure 1:
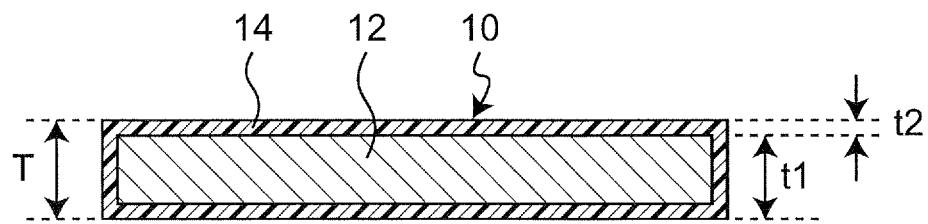
FIG. 1(a) is a cross-sectional view showing an example of a resin-diamagnetic material composite structure of the present invention.
FIG. 1(b) is a perspective view showing an example of a resin-diamagnetic material composite structure of the present invention.
Figure 1:
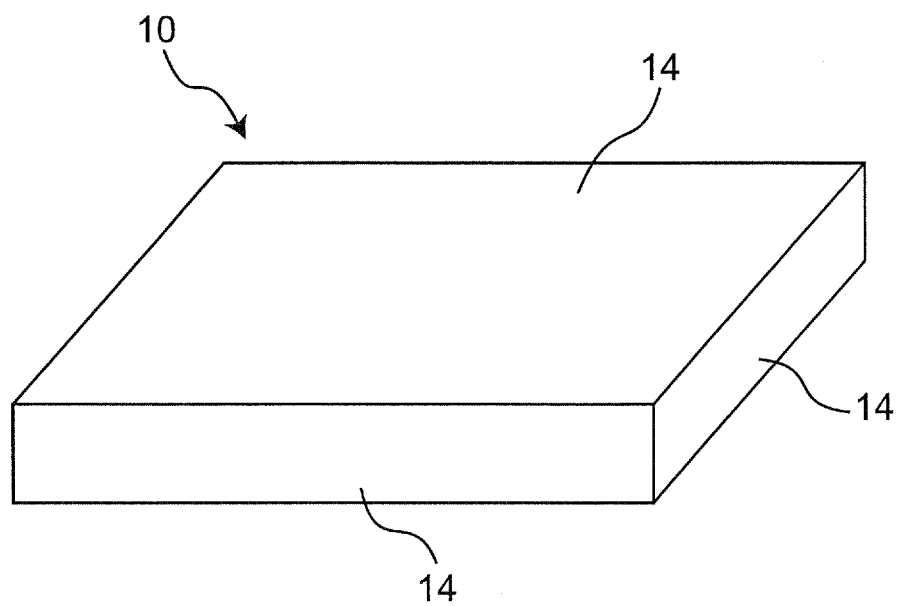

The resin-diamagnetic material composite structure of the present invention (also referred simply to as a "composite structure" in the present description including the following descriptions) includes a diamagnetic material layer and a resin layer. First, a diamagnetic material and a resin, that constitute these layers, will be described.

(Diamagnetic Material)

The diamagnetic material is a material having magnetism in which a force, that is proportional to a product of magnetic field and gradient thereof, is produced in a direction where repulsion against a magnet occurs as a result of magnetization in the opposite direction of a magnetic field when the magnetic field is applied. Specific examples of the diamagnetic material include gold (Au), silver (Ag), copper (Cu), zinc (Zn), mercury (Hg), bismuth (Si), graphite and graphene. Two or more different kinds of diamagnetic materials may be used in combination.

When heat dissipation characteristics of the composite structure are regarded as important, graphite and graphene are preferably used as the diamagnetic material, particularly. This is because graphite and graphene have high thermal conductivity and can constitute a radiating member having satisfactory heat dissipation characteristics.

When noise characteristics of the composite structure is regarded as important, bismuth (Bi) is preferably used as the diamagnetic material, particularly. This is because bismuth exhibits higher diamagnetism and the diamagnetic material can further reduce electromagnetic noise. Bismuth has lower thermal conductivity than that of the other diamagnetic materials. Therefore, it is possible to use, as the diamagnetic material, for example, particles or sheet-like materials obtained by coating a surface of a diamagnetic material having higher thermal conductivity (for example, copper) with bismuth by plating of bismuth. When a bismuth-plated diamagnetic material (for example, copper) is used, it is possible to achieve a composite structure having high electromagnetic noise reduction effect and high heat dissipation effect.

There is no particular limitation on the form of a diamagnetic material in a composite structure. The diamagnetic material may be, for example, in the form of either a sheet or particles. When the diamagnetic material is in the form of particles, a diamagnetic material layer in the composite structure takes the form in which particles are aggregated. As mentioned below, since the composite structure of the present invention is produced by a method of forming a diamagnetic material layer utilizing diamagnetism, a layered structure can be formed even if a diamagnetic material is not in the form of a sheet in advance. In other words, the present invention enables formation of a composite structure using a granular diamagnetic material. When the granular diamagnetic material is used, it is also possible to remarkably decrease the thickness of a diamagnetic material layer by adjusting the dimension of particles and the dimension of a mold used for molding.

There is no particular limitation on the dimension even when the diamagnetic material takes any form. For example, when a sheet-like diamagnetic material is used, a sheet having a thickness of 0.5 µm or more and 150 µm or less may be used. In particular, when the diamagnetic material is graphite or graphene, a sheet having a thickness of 0.5 µm or more and 150 µm or less may be used, and a sheet having a thickness of 0.1 µm or more and 100 µm or less is preferably used. Even when the sheet of graphite or graphene is a thin sheet having a thickness within the above range, it has satisfactory heat dissipation characteristics.

When a granular diamagnetic material is used, for example, particles having a particle diameter of 0.01 µm or more and 250 µm or less may be used. The particle diameter as used herein is measured by a microscope, and refers to a maximum external diameter of particles (length of a maximum line segment among line segments obtained by joining any two points of the contour of particles observed by a microscope). When granular diamagnetic materials, each having a different particle diameter are used, the particle diameter of each particle is preferably within the above range. In particular, when a diamagnetic material is graphite, the particles preferably have a particle diameter of 0.01 µm or more and 250 µm or less, and more preferably a particle diameter of 0.01 µm or more and 100 µm or less. Graphite particles having a particle diameter within this range are satisfactorily dispersed when mixed with a resin according to the below-mentioned method before molding. Graphite particles having a particle diameter within this range have more uniform particle size distribution.

When graphite particles are used, particles may be those produced by any method. There is no particular limitation on the shape of graphite particles, and particles may have a scaly, spherical, rod, flaky or needle shape.

When a diamagnetic material layer is formed using particles made of graphite, the diamagnetic material layer exhibits smaller anisotropy of thermal conductivity and electrical conductivity than that of a diamagnetic material layer formed by using a sheet-like graphite or graphene. Accordingly, the granular graphite is preferably used in the case of desiring characteristics in which a diamagnetic material layer exhibits small anisotropy in thermal conductivity and electrical conductivity, and characteristics having thermal conductivity and electrical conductivity in a thickness direction of a composite structure. The sheet-like graphite or graphene commonly has high thermal conductivity in a plane direction.

The granular diamagnetic material may be columnar particles in which the dimension in one direction is significantly larger than the other dimensions. Alternatively, the granular diamagnetic material may be particles having a large face (principal surface) in which the dimension in a direction perpendicular to the large face is significantly small, i.e. platy particles. When the diamagnetic material is a columnar or platy particle, as mentioned below, it is possible to control the direction of thermal conductivity of a composite structure by controlling a major axis (axis corresponding to the direction where the dimension is the largest) of columnar particles or an orientation of a large face (principal surface) of platy particle. Columnar particles may be those in which a cross section has a circular, oval, triangular, rectangular or other shape (amorphous shape). Columnar particles are also called needle particles when a cross section has a comparatively small area. Platy particles may be those in which a large face has a rectangular, circular, oval or triangular shape, or an amorphous shape.

In the diamagnetic material of columnar particles, a ratio (aspect ratio) of a length (dimension of a major axial direction) to a diameter (length of a maximum line segment among line segments obtained by joining any two points of the contour of a particle) of a cross section is preferably 1.01 or more and 20 or less. In the diamagnetic material of platy particles, a ratio (aspect ratio) of a length of a maximum line segment among line segments obtained by joining any two points of the contour of a large face to a dimension in a direction perpendicular to the large face is preferably 1.01 or more and 20 or less. The granular diamagnetic material having such an aspect ratio can impart higher thermal conductivity in a predetermined direction of a composite structure.

The diamagnetic material of columnar particles or platy particles is specifically particles made of graphite. These particles are originally provided as columnar particles or platy particles and are therefore suitably used when thermal conductivity anisotropy is imparted in a desired direction in a composite structure. Alternatively, a diamagnetic material of columnar particles or platy particles may be those obtained by processing gold (Au), silver (Ag), copper (Cu), zinc (Zn), mercury (Hg) or bismuth (Bi) into that shape.

(Resin)

A resin plays a role of covering at least a part of a surface of a diamagnetic material layer in a composite structure thereby to ensure insulation properties in the part. Known resins can be optionally used as long as they have desired insulation properties. It is possible to form a resin layer using, for example, polyethylene (PE), polypropylene (PP), polystyrene (PS), polyvinyl chloride (PVC), chlorinated polyvinyl chloride (CPVC), polyvinylidene chloride (PVDC), polyvinylidene fluoride (PVDF), polyvinyl acetal (PVA), polyurethane (PU), polyamide (PA), polyethylene terephthalate (PET), polybutylene terephthalate (PBT), polyether sulfone (PES), polysulfone (PSF), a phenol resin, a silicone resin, an epoxy resin, a urea resin, an unsaturated polyester resin or a diallyl phthalate resin.

The resin layer is preferably a layer formed by curing a thermosetting resin for the following reason. That is, since a thermosetting resin has fluidity until it is cured by heat, it is easy to move and/or redisperse a diamagnetic material in a mold by a magnetic field when a composite structure is produced by the below-mentioned method. In addition, the thermosetting resin commonly has high heat resistance and excellent heat dissipation and also exhibits high electrical insulation properties. The thermosetting resin is specifically an epoxy resin, a urea resin, an unsaturated polyester resin, polyurethane (PU), and a diallyl phthalate resin. In particular, the epoxy resin is preferably used as the thermosetting resin since it is excellent in fluidity, insulation properties and chemical resistance.

(Resin-Diamagnetic Material Composite Structure)

Figure 2:
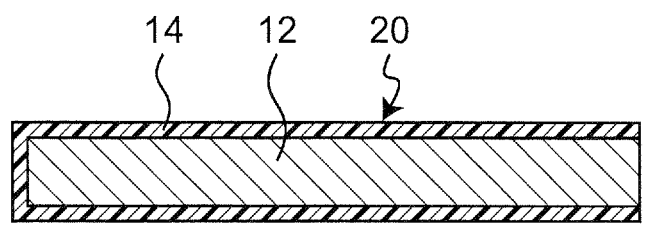
FIG. 2(a) is a cross-sectional view showing another example of a resin-diamagnetic material composite structure of the present invention.
FIG. 2(b) is a perspective view showing another example of a resin-diamagnetic material composite structure of the present invention.
Figure 2:
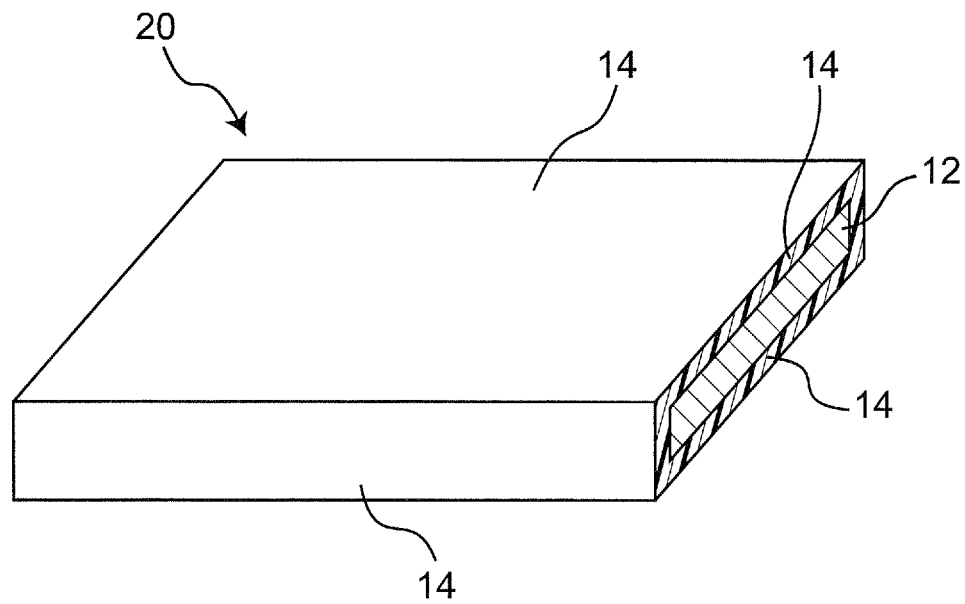

A composite structure of the present invention is produced by the below-mentioned method using the above-mentioned diamagnetic material and resin. For example, the composite structure of the present invention has a cross section as shown in FIG. 1(a) or a cross section as shown in FIG. 2(a), and has an appearance as shown in FIG. 1(b) or an appearance as shown in FIG. 2(b). Both composite structures 10, 20 of FIGS. 1(a) and 1(b) and FIGS. 2(a) and 2(b) are in the form of a sheet that has a large principal surface, and a side having a significantly smaller dimension than that of the principal surface, and two principal surfaces are covered with a resin layer 14. Two principal surfaces as used herein are two parallel opposing surfaces of a diamagnetic material layer 12. In the composite structure 10 of FIGS. 1(a) and 1(b), all sides of the diamagnetic material layer 12 is covered with the resin layer 14. In the composite structure 20 of FIGS. 2(a) and 2(b), in addition to two principal surfaces of the diamagnetic material layer 12, three sides of four sides perpendicular to the principal surface are covered with the resin layer 14 (namely, five surfaces are covered), while one side (first side) is exposed. Herein, the diamagnetic material layer 12 is made of the above-mentioned diamagnetic material and the resin layer 14 is made of the above-mentioned resin.

As shown in FIGS. 1(a) and 1(b) and FIGS. 2(a) and 2(b), the composite structures 10, 20 of the present invention are configured such that all or a part of sides of the diamagnetic material layer 12 are covered with the resin layer 14. Generally, a sheet-like layered structure has a configuration wherein each layer is exposed in the side. In contrast, the side can be formed of a resin by producing the composite structure of the present invention through the below-mentioned method. Therefore, according to the composite structure of the present invention, it is possible to ensure insulation properties even at the side.

In sheet-like composite structures 10, 20 shown in FIGS. 1(a) and 1(b) and FIGS. 2(a) and 2(b), principal surfaces and sides of the diamagnetic material layer 12 are clearly defined, and also principal surfaces and sides of composite structures 10, 20 are clearly defined. However, in the actually obtained sheet-like composite structures 10, 20, the contour of each layer is not necessarily linear and may be sometimes entirely curved, or the edge may be rounded. Regarding such a sheet-like composite structure, when a diamagnetic material layer has faces that can be entirely regarded as two principal surfaces and four sides, and also composite structures 10, 20 can be entirely regarded as a sheet form, the sheet-like composite structure is included in sheet-like composite structures 10, 20 shown in FIGS. 1(a) and 1(b) and FIGS. 2(a) and 2(b).

In sheet-like composite structures 10, 20, a thickness T of the entire sheet-like composite structures 10, 20 is, for example, 10 μm or more and 250 μm or less. A thickness t1 of the diamagnetic material layer 12 is, for example, 0.5 μm or more and 150 μm or less. A thickness t2 (thickness of a layer that covers one face of the diamagnetic material layer 12) of the resin layer 14 is, for example, 4.5 μm or more and 100 μm or less. The thickness T of the entire sheet-like composite structures 10, 20, and the thickness (t1, t2) of each layer can be adjusted by adjusting the dimension of a mold in the below-mentioned production method. Accordingly, when a granular diamagnetic material is used, it is also possible to adjust the thickness t1 of the diamagnetic material layer 12 to less than 0.1 μm. Similarly, it is also possible to adjust the thickness t2 of the resin layer 14 to less than 10 μm. When a sheet-like resin is used, it is difficult to adjust the thickness of the sheet-like resin to less than 10 μm from the viewpoint of handling of a resin.

While the form in which the resin layer 14 has the same thickness t2 at any position was described in FIG. 1(a) and FIG. 2(a), the sheet-like composite structure of the present invention may be a composite structure in which the thickness of the resin layer varies in one form. For example, the thickness of the resin layer on one side (for example, upper side in FIG. 1(a)) of two principal surfaces may be larger than that of the resin layer on the other side (for example, lower side in FIG. 1(a)). Regarding the composite structure in which the thickness of the resin layer on both sides are different from each other, the side where a thickness of a resin layer is large may be located, as the side where a dielectric voltage is higher, at the end close to an element in a semiconductor device, whereby the dielectric voltage of at the end close to the element can be increased.

Figure 7:
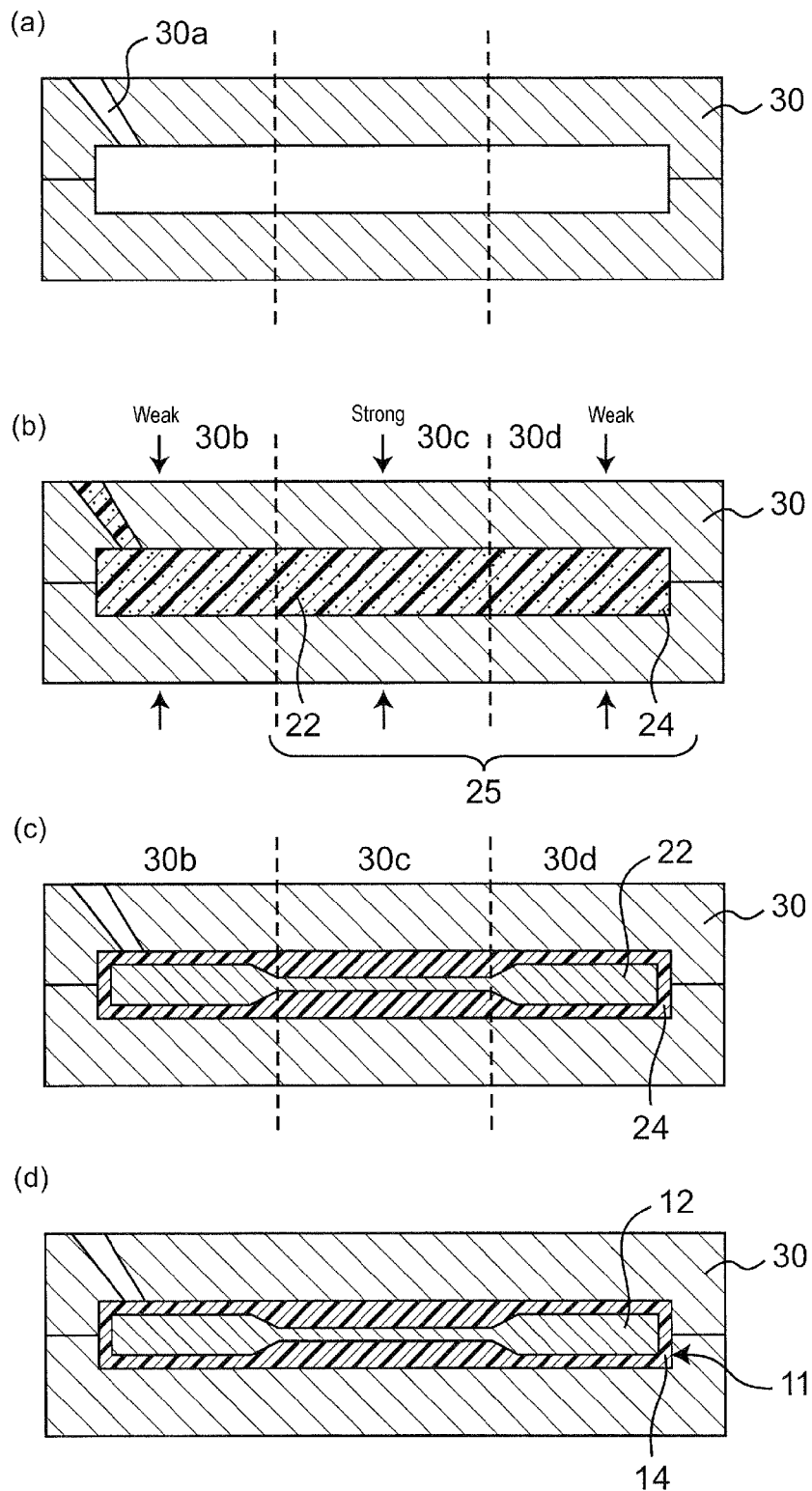
FIGS. 7(a) to 7(d) are cross-sectional views showing process in another example of a method for producing a resin-diamagnetic material composite structure of the present invention.

Alternatively, as shown in FIG. 7(c), the thickness of a resin layer may be varied by varying the intensity of a magnetic field in a mold when a composite structure is produced by the below-mentioned method. For example, it is possible to increase the dielectric voltage of the side close to an element by decreasing a magnetic field in a mold on the side close to an element.

Since a diamagnetic material layer 12 and a resin layer 14 are integrally molded, the diamagnetic material layer 12 and the resin layer 14 is closely adhered without any space at an interface therebetween in a composite structure. When the diamagnetic material layer 12 is made of particles, particles aggregate to form a layer. When a composite structure is produced by the below-mentioned method, a resin may be sometimes completely separated from particles in the process where particles aggregate and the resin may penetrate into the interior of the diamagnetic material layer 12 thereby to form a thin film between particles. When the diamagnetic material layer 12 is made of particles, particles may sometimes aggregate to form one large particle, and thus a film of a resin may be formed between large particles. In the present invention, a layer including such a film is also included in the diamagnetic material layer 12.

When the diamagnetic material layer 12 is made of columnar particles or platy particles, it is possible to line up a major axis of columnar particle or a large face of platy particles in a direction of a magnetic field by controlling a direction where the magnetic field is applied when a composite structure is produced by the below-mentioned method. Columnar particles and platy particles made of a diamagnetic material exhibit higher thermal conductivity in a major axial direction and a plane direction, respectively. Accordingly, if the respective directions are made parallel to a thickness direction of a sheet-like composite structure, it is possible to obtain a composite structure in which thermal conductivity in a thickness direction exhibits high thermal conductivity anisotropy.

When two or more kinds of diamagnetic materials, each having a different specific gravity, are used, a diamagnetic material having a larger specific gravity is likely to locate the perpendicular lower side. Therefore, when bismuth and graphite are used in combination as a diamagnetic material, it is conceived of obtaining a diamagnetic material layer 12 having a layered structure in which the composition of a diamagnetic material in one surface is different from that in the other surface since bismuth has a larger specific gravity than that of graphite.

A method for producing a composite structure of the present invention will be described below by way of a method for producing a composite structure 10 as an example with reference to FIG. 3 and FIGS. 4(a) to 4(c). Herein, a description is made on a method in which a composite structure is formed by using granular graphite for a diamagnetic material layer 12 and using a thermosetting resin for a resin layer 14. FIG. 4(a) shows a mold 30 used in transfer molding. First, as shown in FIG. 4(a), a mold 30 is disposed (step S01 in FIG. 3). In FIG. 4(a), the mold 30 is closed, and the shape and dimension of a cavity (space) formed inside determine the shape and dimension of a composite structure to be produced. The mold 30 defines two parallel opposing inner surfaces (faces in upper and lower directions in the drawing) in a closed state. Herein, two parallel opposing inner surfaces are surfaces that form two principal surfaces of a composite structure to be molded. The mold 30 is formed of a magnetic material, and a magnetic field can be applied to the interior of a cavity of the mold 30 by applying a current from a power supply (not shown). It is possible to use, as a magnetic material that forms the mold 30, for example, iron oxide, chromium oxide, cobalt ferrite or an amorphous alloy.

Figure 3:
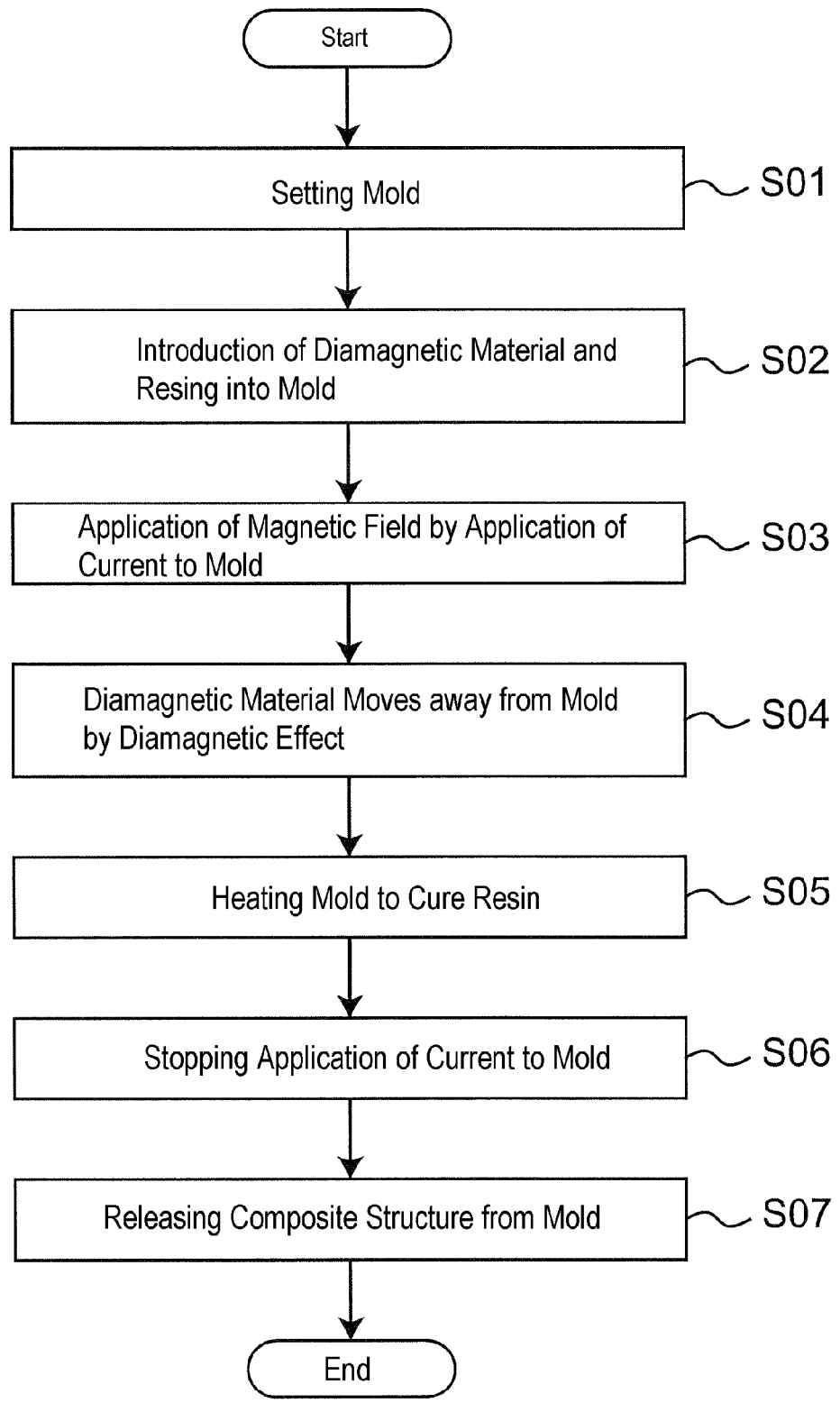
FIG. 3 is a flow chart of a method for producing a resin-diamagnetic material composite structure of the present invention.
Figure 4:
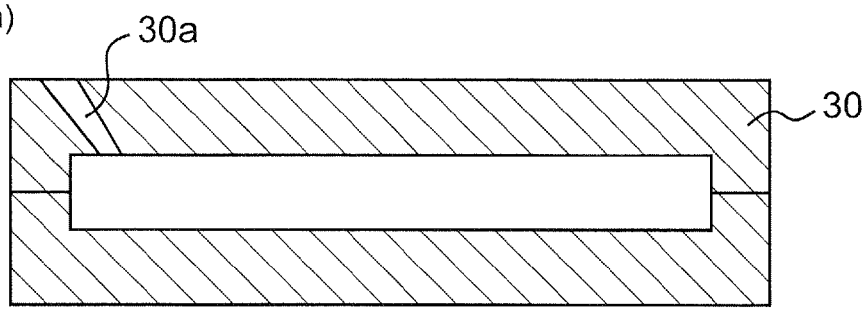
FIGS. 4(a) to 4(d) are cross-sectional views showing process in an example of a method for producing a resin-diamagnetic material composite structure of the present invention.
Figure 4:
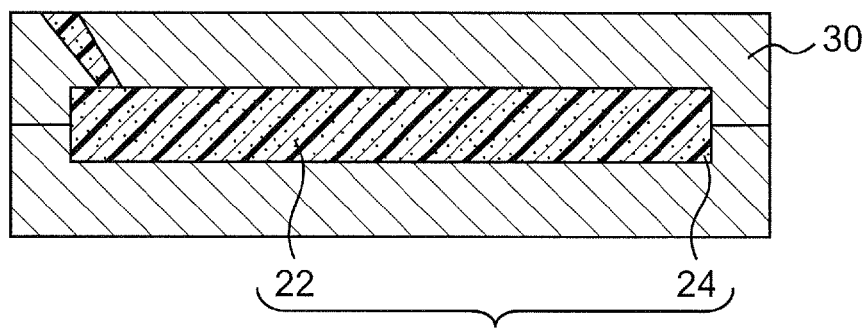
Figure 4:
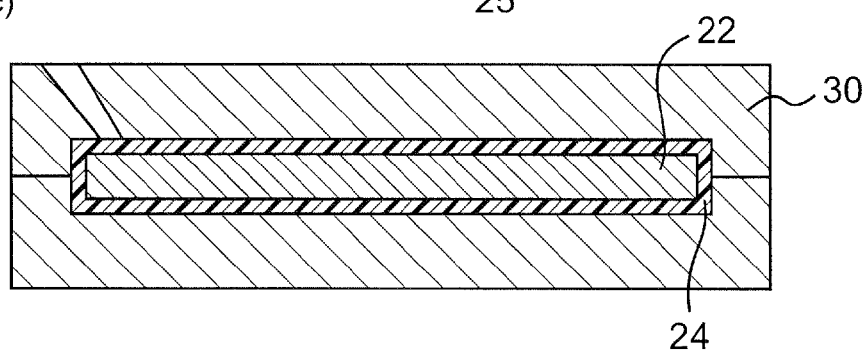
Figure 4:
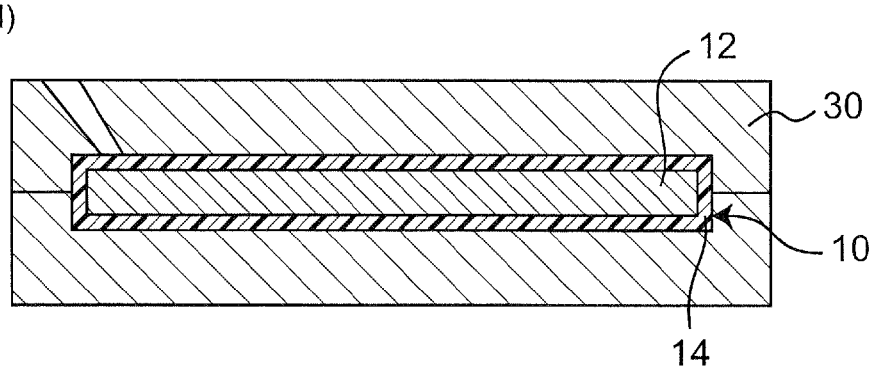

A mixture 25 of a thermosetting resin 24 and a diamagnetic material 22 is introduced into a cavity of a mold 30 through an injection port 30a (FIG. 4(b), step S02 in FIG. 3). The resin 24 is a material before curing, and the mixture 25 of a thermosetting resin 24 and a diamagnetic material 22 has fluidity. In the mixture 25, particles of the diamagnetic material 22 are dispersed in the liquid resin 24. The mixture 25 is introduced into the mold 30 while applying a pressure using an appropriate plunger (not shown). After filling the cavity of the mold 30 with the mixture 25, a pressure is applied to the mixture 25 in the mold 30 by further keeping a predetermined pressure for 90 to 180 seconds (pressure keeping). The predetermined pressure is, for example, 100 kgf (9.8 MPa).

A magnetic field is applied to the diamagnetic material 22 in the cavity by applying a current to the mold 30 during injection of the mixture 25 into the cavity of the mold 30 and pressure keeping (step S03 in FIG. 3). As a result of application of the magnetic field to the diamagnetic material 22, the diamagnetic material 22 uniformly moves to a direction away from an inner surface of the mold 30 (step S04 in FIG. 3), and thus the resin 24 is extruded in the direction toward the inner surface of the mold 30. As a result, as shown in FIG. 4(c), a structure in which the layered diamagnetic material 22 is included in the resin 24 is obtained. While applying the magnetic field, a magnetic flux density is, for example, 0.5 T or more, and preferably 10 T or more.

Next, the resin 24, that is thermosetting resin, is cured by applying heat to the mixture 25 thereby to convert into a resin layer 14 (step S05 in FIG. 3). The diamagnetic material 22 becomes a diamagnetic material layer 12. Thereafter, application of the magnetic field into the cavity is terminated by stopping application of a current to the mold 30 (step S06 in FIG. 3). Whereby, as shown in FIG. 4(d), a composite structure 10 of the present invention in which a surface of the diamagnetic material layer 12 is covered with the resin layer 14 is produced, and then the mold 30 is opened and the composite structure 10 is removed from the mold (step S07 in FIG. 3).

Herein, since the entire inner surface of the mold 30 is formed of a magnetic material, the diamagnetic material 22 moves away from the entire inner surface of the mold 30, and thus making it possible to produce a composite structure 10 in which the entire surface of the diamagnetic material layer 12 is covered with the resin layer 14. As shown in FIGS. 2(a) and 2(b), in the case of producing a composite structure 20 in which the diamagnetic material layer 12 is exposed in the first side, a portion of the mold 30 in contact with the first side is formed of a material other than a magnetic material so as not to apply a magnetic field to the first side. When the diamagnetic material layer 12 is formed of a sheet-like diamagnetic material 22, for example, the diamagnetic material 22 is disposed in advance in the cavity of the mold 30 shown in FIG. 4(a), and then the resin 24 is injected into the cavity. Namely, step S02 in FIG. 3 is dividedly performed in two flows.

Herein, an example of a production method using a mold 30 made of a magnetic material was described. However, if a magnetic field can be applied into the objective mold in the present invention, another means for applying a magnetic field may also be used without using the mold 30 made of a magnetic material. In that case, the magnetic field is applied such that the diamagnetic material goes away from the inner surface of the mold at the position corresponding to a surface of a diamagnetic material layer to be covered with a resin layer. The means for applying a magnetic field may be either a device for generating a magnetic field, or a magnet mounted in or attached to the mold.

The intensity of the magnetic field to be formed in the mold 30 may not be uniform and also may be increased, as compared with the other portion, in a part. In that case, in the region where a stronger magnetic field than that of the other region is formed, a diamagnetic material 22 further moves away from the strong magnetic field, and thus the thickness of a resin layer 14 increases. For example, as shown in FIG. 7(a), when the cavity formed by the mold 30 is divided into three portions (30b, 30c, 30d), if a current is applied such that a stronger magnetic field is applied to a center portion 30c and a weaker magnetic field is applied to both end portions 30b, 30d as shown in FIG. 7(b), the thickness of the diamagnetic material 22 decreases and the thickness of the resin 24 of the mixture 25 increases in the center portion 30c as shown in FIG. 7(c). Therefore, in a composite structure 11 formed by curing the resin 24, the thickness of the resin layer 14 increases in the center portion 30c, and the thickness of the diamagnetic material layer 12 increases in both end portions 30b, 30d as shown in FIG. 7(d). The intensity of the magnetic field is controlled, for example, by providing electrical wiring in a desired site of the mold 30 and adjusting a value of current to be applied to this electrical wiring so as to generate a magnetic field.

As mentioned above, the diamagnetic material layer 12 may be formed of columnar or platy particles. In that case, upon formation of the magnetic field in the mold 30, the direction of the magnetic field is preferably controlled such that a major axis of columnar particles or a large face of platy particles is made parallel to a desired direction. For example, when the magnetic field is applied such that the direction of the magnetic field is made parallel to a thickness direction of composite structures 10, 11, a major axis of columnar particles or a large face of platy particles is made parallel to a thickness direction of composite structures 10, 11. The magnetic field in a direction parallel to a thickness direction of composite structures 10, 11 is formed by applying a current to electrical wiring disposed in the mold 30 so as to generate a desired magnetic field. A magnetic field in a direction parallel to a thickness direction of composite structures 10, 11 is formed, for example, by providing electrical wiring on the two parallel opposing inner surfaces (faces in upper and lower directions) defined by the mold 30 such that the wiring is parallel to the inner surfaces when a magnetic field is respectively applied from the two inner surfaces, and applying a current to this electrical wiring thereby to generate a magnetic field, in FIG. 4.

A method for molding a composite structure is not limited to a transfer molding method, and may be another molding method such as an injection molding or a compression molding method. For example, when the resin 24 is a thermoplastic resin, molding may be performed by an injection molding method. Alternatively, a method for molding a composite structure may be a compression molding method. In the case of using any molding method, when the diamagnetic material layer 12 is formed of particles, it is necessary for the resin 24 to have fluidity such that the granular diamagnetic material 22 can move when a magnetic field is applied. When a thermoplastic resin is subjected to injection molding, it is necessary for a clearance between upper and lower sections of the mold 30 to be adjusted to 5 μm or less since burr generates in the periphery.

The sheet-like composite structure and a method for producing the same are described above. The sheet-like composite structure may also be called a layered structure. The sheet-like composite structure is convenient, particularly in a semiconductor device. The sheet-like composite structure is not limited to the configuration shown in the drawing and, for example, it may be configured that at least one principal surface and at least two sides of the diamagnetic material layer 12 are covered with a resin layer. The production method of the present invention makes it possible to produce easily the configuration in which at least three surfaces of a diamagnetic material layer 12 are covered with a resin layer 14. The composite structure is not limited to a sheet-like structure and may have a rectangular parallelepiped or cubic shape having a comparatively large thickness.

Alternatively, it is also possible to obtain a structure having another shape (for example, spherical, cylindrical or another spatial shape) including a diamagnetic material layer 12 inside by applying the present invention. It is also possible to obtain a resin molded article having any shape in which a part or all of a surface of a diamagnetic material layer 12 is covered with a resin layer 14, by molding using a mold 30 while applying a magnetic field. For example, when a mold for molding a sphere is used, a spherical composite structure including a spherical diamagnetic material layer 12 therein can be obtained. In a composite structure that is not in the form of a sheet, the diamagnetic material layer 12 may not be sometimes in the form of a rectangular or thin film, and the layer having such a shape or form is also conveniently included in a "diamagnetic material layer" referred to in the present description.

(Semiconductor Device)

The thus obtained composite structure can be used as a component in a semiconductor device since at least a part of a surface of a diamagnetic material layer 12 is covered with a resin layer 14 that is an insulating layer. When the diamagnetic material layer 12 is made of graphite, since the diamagnetic material layer 12 has excellent thermal conductivity, a composite structure is preferably used as a heat dissipating member (for example, a heat dissipating block or a heat dissipating fin). When a diamagnetic material 22 is placed in a magnetic field of a predetermined direction, the magnetic field is offset by another magnetic field which is caused by the diamagnetic material 22 that has a property of reflecting electromagnetic wage. Therefore, the composite structure also plays a role of reducing electromagnetic wave generated from elements or components that constitute a semiconductor device.

Figure 5:
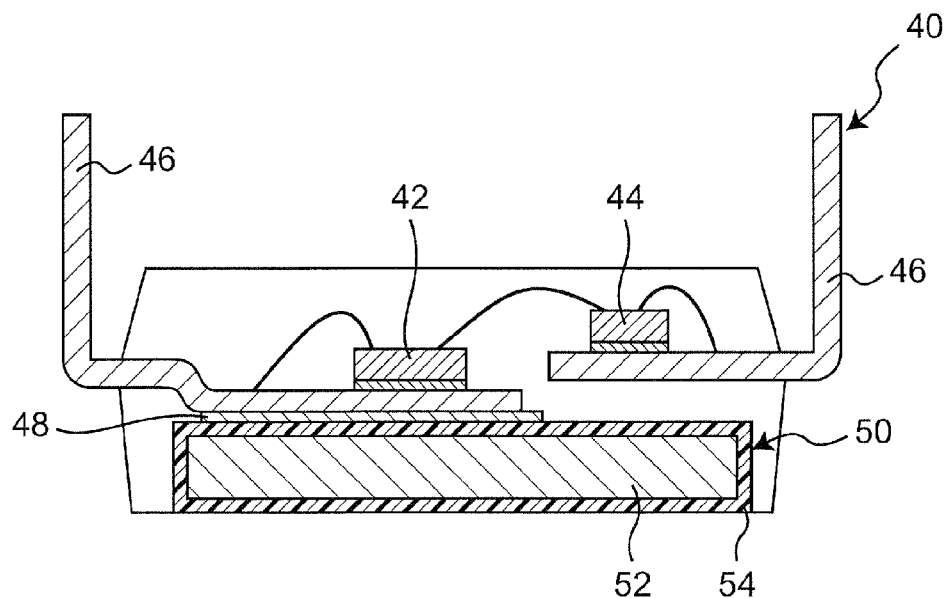
FIG. 5 is a cross-sectional view showing an example of a power module of the present invention.
Figure 6:
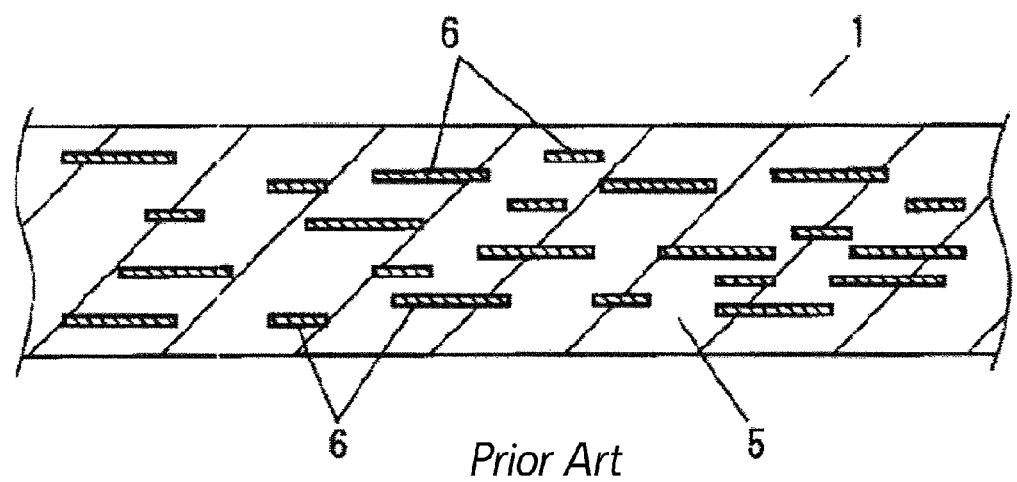
FIG. 6 is a partial cross-sectional view of a graphite sheet of JP-A-2006-165153.

FIG. 5 shows a cross section of an example of a power module in which a composite structure of the present invention has been incorporated. A power module 40 shown in FIG. 5 includes a power element 42 and a driver element 44, which are attached to a die pad 46 of a metal lead frame made of metal. The power element 42 and the driver element 44 are connected to each other by a wire. To the die pad 46 to which the power element 42 is attached, a sheet-like composite structure 50 of the present invention is attached by a conductive paste 48. The conductive paste 48 is prepared by dispersing conductive particles in a resin, and plays a role of transporting heat released from the power element 42 to the composite structure 50. A power module 40 or a power semiconductor including the power module incorporated therein is an example of semiconductor devices.

Since the composite structure 50 includes a diamagnetic material layer 52 made of metal or graphite having high thermal conductivity, it functions as a radiating member and causes release of heat generated by the power element 42 outside thereby to reduce deterioration and trouble of a semiconductor device due to heat, and thus improving reliability and lifetime. A resin layer 54 of the composite structure 50 functions as an insulating layer and prevents a current from flowing into the diamagnetic material layer 52.

Since the composite structure 50 also reflects electromagnetic wave, it causes generation of a magnetic field opposite to the magnetic field generated by the power element 42, and thus reducing intensity of the magnetic field generated by an operation of the power element 42. In the driver element 44 to be used together with the power element 42, unnecessary electrical signal (i.e. electromagnetic noise) is likely to be generated by an influende of electromagnetic wave. Electromagnetic noise is not desired since it causes an incorrect operation of the power module 40. The composite structure 50 may play a role of reducing electromagnetic noise. In particular, in the composite structure 50, when the diamagnetic material layer 52 is made of bismuth having high diamagnetism, or the other diamagnetic material whose surface is coated with bismuth, electromagnetic noise may be further reduced.

The resin-diamagnetic material composite structure of the present invention enables use of a layer made of a diamagnetic material having high thermal conductivity, such as graphite, in a state where insulation properties are imparted to the surface thereof, and it is useful as a radiating member of a semiconductor device.

What is claimed is:

1. A resin-diamagnetic material composite structure, comprising:
    a diamagnetic material layer, and
    a resin layer that covers at least a part of a surface of the diamagnetic material layer, wherein
    the diamagnetic material layer is a layer formed by aggregation of particles of a diamagnetic material;
    wherein
    the diamagnetic material layer has two parallel surfaces, and one or a plurality of sides perpendicular to said two surfaces, and
    the resin layer covers said two surfaces and at least one side of said one or plurality of sides.

2. A resin-diamagnetic material composite structure, comprising:
    a diamagnetic material layer, and
    a resin layer that covers at least a part of a surface of the diamagnetic material layer, wherein
    the diamagnetic material layer is a layer formed by aggregation of particles of a diamagnetic material;
    wherein
    the diamagnetic material layer has a thin center portion in a direction perpendicular to a thickness direction of the resin-diamagnetic material composite structure, and
    the resin layer has a thick center portion in a direction perpendicular to a thickness direction of the resin-diamagnetic material composite structure.

3. The resin-diamagnetic material composite structure according to claim 1, wherein
    the resin layer has a thickness of less than 10 μm.

4. The resin-diamagnetic material composite structure according to claim 1, wherein
    particles of the diamagnetic material are columnar particles or platy particles, and
    a major axis of the columnar particles or a large face of the platy particles is oriented in a direction parallel to a thickness direction of the resin-diamagnetic material composite structure, in the diamagnetic material layer.

5. The resin-diamagnetic material composite structure according to claim 1, wherein
    the diamagnetic material is graphite.

6. The resin-diamagnetic material composite structure according to claim 1, wherein
    the diamagnetic material is bismuth, or a material whose surface is coated with bismuth.

7. The resin-diamagnetic material composite structure according to claim 1, wherein
    the resin layer is a layer formed by curing a thermosetting resin.

8. A semiconductor device comprising the resin-diamagnetic material composite structure according to claim 1 as a radiating member.

9. The resin-diamagnetic material composite structure according to claim 2, wherein the resin layer has a thickness of less than 10 μm.

10. The resin-diamagnetic material composite structure according to claim 2, wherein particles of the diamagnetic material are columnar particles or platy particles, and
    a major axis of the columnar particles or a large face of the platy particles is oriented in a direction parallel to a thickness direction of the resin-diamagnetic material composite structure, in the diamagnetic material layer.

11. The resin-diamagnetic material composite structure according to claim 2, wherein the diamagnetic material is graphite.

12. The resin-diamagnetic material composite structure according to claim 2, wherein the diamagnetic material is bismuth, or a material whose surface is coated with bismuth.

13. The resin-diamagnetic material composite structure according to claim 2, wherein the resin layer is a layer formed by curing a thermosetting resin.

14. A semiconductor device comprising the resin-diamagnetic material composite structure according to claim 2 as a radiating member.

* * * * *